US006486711B1

(12) United States Patent
Tsay et al.

(10) Patent No.: US 6,486,711 B1
(45) Date of Patent: Nov. 26, 2002

(54) CAPACITOR-BASED EXPONENTIAL PROGRAMMABLE GAIN AMPLIFIER

(75) Inventors: Ching-Yuh Tsay, Plano, TX (US); Haydar Bilhan, Dallas, TX (US); Gary Lee, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/705,649

(22) Filed: Nov. 3, 2000

Related U.S. Application Data

(63) Continuation of application No. 09/354,461, filed on Jul. 15, 1999, now abandoned.
(60) Provisional application No. 60/092,914, filed on Jul. 15, 1998.

(51) Int. Cl.[7] .............................................. G11C 27/02
(52) U.S. Cl. ......................................... 327/96; 327/561
(58) Field of Search .............................. 327/91, 93, 94, 327/95, 96, 337, 346, 350, 554, 561, 563; 330/254, 252, 253, 260

(56) References Cited

U.S. PATENT DOCUMENTS

| 4,855,685 A | * | 8/1989 | Hochschild | 330/282 |
|---|---|---|---|---|
| 5,105,163 A | * | 4/1992 | Voorman | 330/107 |
| 5,144,160 A | * | 9/1992 | Lee et al. | 327/96 |
| 5,168,461 A | * | 12/1992 | Wu et al. | 708/819 |
| 5,330,512 A | * | 7/1994 | Hauck et al. | 607/28 |
| 5,486,791 A | | 1/1996 | Spitalny et al. | 330/282 |
| 5,680,072 A | * | 10/1997 | Vulih et al. | 327/554 |
| 5,689,201 A | * | 11/1997 | Temes et al. | 327/95 |
| 5,698,999 A | * | 12/1997 | Etoh et al. | 327/94 |
| 5,764,695 A | | 6/1998 | Nagaraj et al. | 375/232 |
| 5,877,612 A | * | 3/1999 | Straw | 330/254 |
| 6,049,252 A | | 4/2000 | Iwata | 330/254 |
| 6,121,908 A | * | 9/2000 | Sevastopoulos et al. | 330/85 |
| 6,169,427 B1 | * | 1/2001 | Brandt | 327/94 |
| 6,232,834 B1 | * | 5/2001 | Zheng | 330/107 |

OTHER PUBLICATIONS

A CMOS Analog Front-End Chip-Set for Mega Pixel Camcorders; Session 11/Integrated Sensors and Display Circuits; Feb. 8, 2000.
A Low-Power CMOS VGA for 50 Mb/s Disk Drive Read Channels; IEEE Transactions on Circuits and Systems—II: Analog and Digital Signal Processing, vol. 42, No. 6, Jun. 1995; Ramesh Harjani; pp. 370–376.

* cited by examiner

Primary Examiner—Matthew Smith
Assistant Examiner—Paul Dinh
(74) Attorney, Agent, or Firm—April M. Mosby; W. James Brady; Frederick J. Telecky, Jr.

(57) ABSTRACT

A CMOS programmable gain amplifier (10) is disclosed which provides exponential gain using a single gain element (19) which may be implemented in either bipolar or CMOS technology. An embodiment of the present invention includes a first and second sampling impedance (12, 14), a first and second feedback impedance (16, 18) and a gain element (19). The gain element (19) having an inverting input, a non-inverting input and an output. The inverting input connects to the first sampling impedance (12). The non-inverting input connects to the second sampling impedance (14). The first feedback impedance (16) connects between the inverting input and the output. The second feedback impedance (18) connects between the non-inverting input and the output.

15 Claims, 3 Drawing Sheets

CAPACITOR-BASED EXPONENTIAL PROGRAMMABLE GAIN AMPLIFIER

CROSS REFERENCE TO RELATED APPLICATION

This application is a continuation of U.S. application Ser. No. 09/354,461, filed Jul. 15, 1999, now abandoned, which claims priority under 35 U.S.C. §119(e)(1) of provisional application No. 60/092,914, filed Jul. 15, 1998. The present invention relates to a copending application entitled "A CMOS Analog Front End Architecture With Variable Gain For Digital Cameras And Camcorders," Serial No. TBN, filed on Sep. 3, 2000, which claims priority under 35 U.S.C. §119(e)(1) of provisional application No. 60/152,436, filed on Sep. 3, 1999 both of which are incorporated by reference herein.

FIELD OF THE INVENTION

The present invention relates to programmable gain amplifiers and, more particularly, to a programmable gain amplifier having impedance networks enabling exponential gain and loss which may be implemented in bipolar and CMOS technologies.

BACKGROUND OF THE INVENTION

Programmable gain amplifiers (PGAs) are used in many applications including digital cameras, camcorders and disk drives. Advances in integrated circuit design and manufacturing have enabled low cost, highly integrated, high performance image processing products such as the digital camera and camcorder. The market for smaller disk drives having reduced power consumption has increased the need for integrated read channel electronics on a single mixed-signal CMOS chip. Existing standard bipolar PGAs dissipate a substantial amount of power and exhibit linear gain. Since a PGA forms an important component of the read channel and helps to stabilize the voltage supplied to the detector and filter sections of the reach channel, it too must be integrated into a single mixed-signal CMOS chip. Previous attempts at developing a CMOS compatible PGA have resulted in a PGA design having the necessary gain control characteristics yet still dissipating substantial power.

An example of such, disclosed in U.S. Pat. No. 5,486,791, which is incorporated by reference herein, presents a PGA including a first and second gain element connected by an impedance selector which allows programmability of the gain of both gain elements. The impedance selector places impedance in the feedback path of the first gain element or the input path of the second gain element. This approach, however, dissipates a substantial amount of power and has a linear gain increase. Exponential gain to linear control voltage characteristic is preferred over linear gain for read channel automatic gain control loops to minimize variations in the output voltage. Thus, most disk drives require that the PGA exhibit exponential gain. Therefore, this approach is not suitable for read channel automatic gain control loops.

An approach having an exponential gain is disclosed in U.S. Pat. No. 6,049,252, which is incorporated by reference herein. The PGA provides sufficiently fine and linear gain control to provide an exponential output according to the logic levels of control signals. It includes a cascade connection of differential amplifiers and a current controller for controlling a product of corresponding emitter currents supplied to each of the differential amplifiers according to the logic levels of binary control signals. The current controller has a current mirror circuit in which the emitter of each bipolar transistor is connected to the ground through a MOS transistor having a relative on-resistance designed to be in inverse proportion to the relative emitter size of the bipolar transistor, so that the emitter current can be exactly controlled. Bipolar transistors having the same size or units of impedance are used in this design to implement the exponential gain. The use of these transistors, however, limits the range of the PGA. Furthermore, each transistor may not be linear. Moreover, even though this design may result in a PGA having the necessary gain control characteristics, it still dissipates substantial power. A significant percentage of this power is dissipated in generating the exponential current output for the linear voltage input. Although this approach, is implemented in bipolar technology, it is not easily implemented in CMOS as is explained in reference to a third approach.

This third approach disclosed in "A Low-Power CMOS VGA for 50 Mb/s Disk Drive Read Channels," Ramesh Harjani, IEEE Transactions on Circuits and Systems—II: Analog and Digital Signal Processing, Vol. 42, No. 6, June 1995, is a methodology for generating the desired exponential transfer characteristics intrinsically using only MOS devices within the variable gain amplifier structure. This approach appears to be a CMOS implementation of the second approach cited above. Since CMOS transistors have a square root relationship, however, it necessitates the implementation of duplicate circuitry to get rid of the square root relationship. As a result of multiplying two square root circuits to eliminate the square root relationship, linear gain exists. In addition, this implementation is very cumbersome to implement, the range is limited, and distortion exists.

Besides the desired exponential transfer characteristics, applications such as the digital camera require that a PGA operate under conditions where current is not continuously supplied. The conventional digital camera includes an image sensor, an analog front end (AFE), and a digital image processor. Most AFEs include three elements: a correlated double sampler (CDS), a programmable gain amplifier (PGA) and an analog to digital converter (ADC). In operation, a signal comes into the camera and is held. No continuous signal exists in such an application. The third approach presented above, however, requires that current be continuously applied to the PGA input in order to operate correctly.

Thus, there exists a need for a CMOS PGA having an exponential gain that operates given non-continuous current conditions.

SUMMARY OF THE INVENTION

To address the above-discussed deficiencies of programmable gain amplifiers (PGAs), the present invention teaches a PGA having an exponential gain including a gain element wherein the PGA may be implemented in either bipolar or CMOS technology.

One embodiment of the present invention includes a sampling impedance, a feedback impedance, and a gain element. The gain element having an input and an output. The input connects to the sampling impedance. The feedback impedance connects between the input and the output.

$$\left| \frac{V_0+ - V_0-}{V_i+ - V_i-} \right| = \frac{(1+X)C_S}{(1-X)C_S} = \frac{1+X}{1-X}$$

Another embodiment of the present invention includes a first and second sampling impedance, a first and second feedback impedance and a gain element. The gain element having an inverting and non-inverting input and an inverting and non-inverting output. The inverting input connects to the first sampling impedance. The non-inverting input connects to the second sampling impedance. The first feedback impedance connects between the inverting input and the non-inverting output. The second feedback impedance connects between the non-inverting input and the inverting output.

In another embodiment of the present invention includes a first and second sampling impedance, a first, second, third and fourth feedback impedance and a gain element. The gain element having an inverting and non-inverting input and an inverting and non-inverting output. The inverting input connects to the first sampling impedance. The non-inverting input connects to the second sampling impedance. The first feedback impedance connects between the inverting input and the non-inverting output. The second feedback impedance connects between the non-inverting input and the inverting output. The third feedback impedance connects between the inverting input and the inverting output. The fourth feedback impedance connects between the non-inverting input and the non-inverting output.

Advantages of this design include but are not limited to programmable gain amplifier implementable in bipolar or CMOS technology. This PGA has exponential gain characteristics without dissipating substantial power. Since the gain characteristic of the programmable gain amplifier in accordance with the present invention depends upon the impedance of a capacitor, the gain is more precise than others.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein:

FIG. 9 is a block diagram of a the embodiment of the programmable gain amplifier in FIG. 7 using the feedback impedance of FIG. 8a.

DETAILED DESCRIPTION OF PREFERRED EMBODIMENTS

Figure 1:
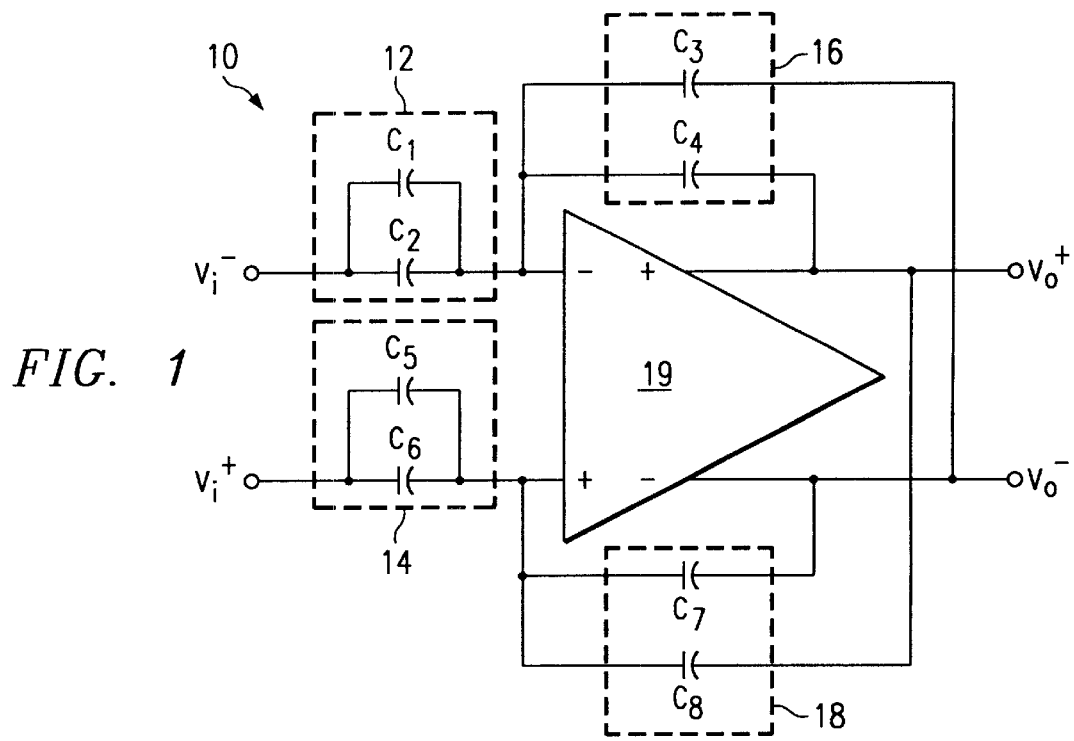
FIG. 1 is a block diagram of a first embodiment of the programmable gain amplifier in accordance with the present invention.

The embodiment of the PGA 10 in accordance with the present invention disclosed in FIG. 1 is designed to provide an exponential gain. As shown, PGA 10 having inputs, $V_i^-$ and $V_i^+$, and outputs, $V_o^-$ and $V_o^+$, includes a first and second sampling impedance, 12 and 14, connected to inputs, $V_i^-$ and $V_i^+$, a gain element 19 and a first and second feedback impedance, 16 and 18. Gain element 19 includes an inverting and non-inverting input and an inverting and non-inverting output, wherein the inverting and non-inverting outputs are connected to outputs, $V_o^-$ and $V_o^+$, respectively. The inverting input connects to the first sampling impedance 12. The non-inverting input connects to the second sampling impedance 14. As shown the first sampling impedance 12 includes capacitors $C_1$ and $C_2$ coupled in parallel and the second sampling impedance 14 includes capacitors $C_5$ and $C_6$. The first feedback impedance $C_4$ connects between the inverting input and the non-inverting output. The second feedback impedance $C_7$ connects between the non-inverting input and the inverting output. The third feedback impedance $C_3$ connects between the inverting input and the inverting output. The fourth feedback impedance $C_8$ connects between the non-inverting input and the non-inverting output. Capacitors $C_2$, $C_4$, $C_5$ and $C_7$ of capacitance $C_s$; while $C_1$, $C_3$, $C_6$, and $C_8$ are variable capacitors $C_x = xC_S$ capacitors.

PGA 10 uses only CMOS components to achieve an exponential gain characteristic with linear control signals. The exponential gain characteristic is implemented with the approximate function of:

$$G(X) = (1+X)/(1-X) \qquad [1]$$

The gain function, G(x), provides the necessary transfer characteristics where $-0.7 < x < 0.7$. To implement the gain function G(x) in CMOS, gain function of PGA 10 in FIG. 1 is $$\left| \frac{V_0+ - V_0-}{V_i+ - V_i-} \right| = \frac{(1+X)C_S}{(1-X)C_S} = \frac{1+X}{1-X} \qquad [2]$$

By changing the variable X, a variable gain function as expressed by Equation 2 can be realized. Accordingly, an exponential gain with linear control (x) is realized. The use of capacitors $C_1$–$C_8$ provides the inherent hold function for the sample and hold PGA 10.

Figure 2:
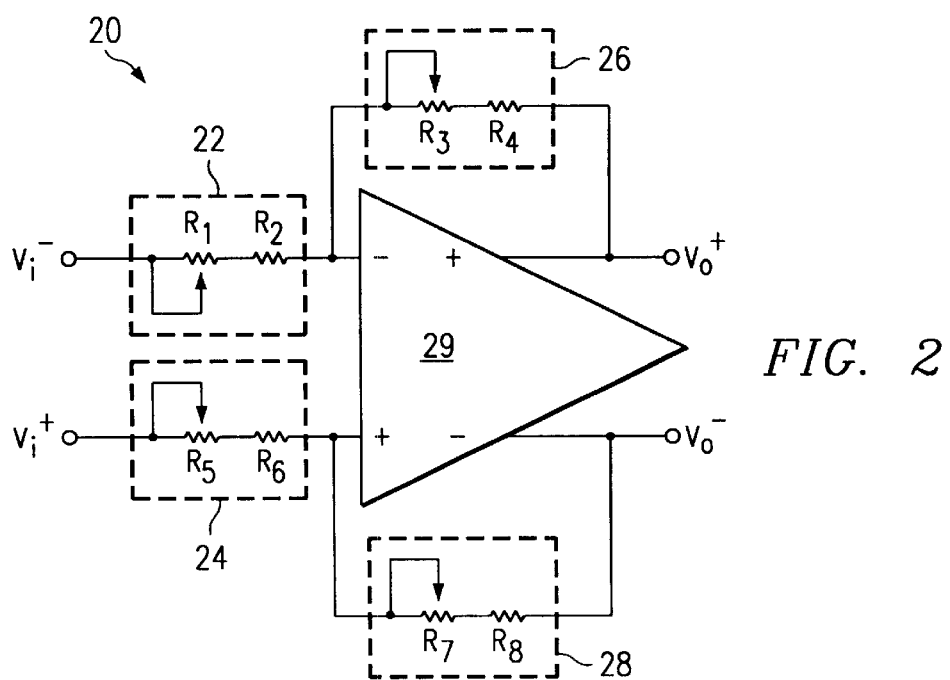
FIG. 2 is a block diagram of a second embodiment of the programmable gain amplifier in accordance with the present invention.

Another embodiment of the present invention as shown in FIG. 2 of PGA 20 having inputs, $V_i^-$ and $V_i^+$, and outputs, $V_o^-$ and $V_o^+$, includes a first and second sampling impedance, 22 and 24, a first and second feedback impedance, 26 and 28, and a gain element 29. The first and second impedance, 22 and 24, connect to inputs, $V_i^-$ and $V_i^+$. Gain element 29 includes an inverting and non-inverting input and an inverting and non-inverting output, wherein the inverting and non-inverting outputs are connected to outputs, $V_o^-$ and $V_o^+$, respectively. The inverting input connects to the first sampling impedance 22. The non-inverting input connects to the second sampling impedance 24. As shown the first sampling impedance 22 includes resistors $R_1$ and $R_2$ coupled in series and the second sampling impedance 24 includes resistors $R_5$ and $R_6$. The first feedback impedance 26 connects between the inverting input and the non-inverting output. The second feedback impedance 28 connects between the non-inverting input and the inverting output. As shown the first feedback impedance 26 includes resistors $R_3$ and $R_4$ coupled in series and the second feedback impedance 28 includes resistors $R_7$ and $R_8$. Here, the exponential function is implemented through the use of resistors $R_1$–$R_8$.

Figure 3A:
FIGS. 3a and b display sampling impedance of the second embodiment in accordance with the present invention.
Figure 3B:
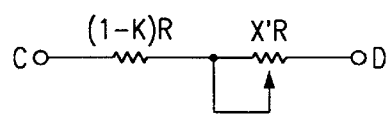

Resistance $(I+X)R$ and $(1-X)R$ are implemented using CMOS switches at linear tap points as shown in FIGS. 3a and 3b, respectively. FIG. 3a illustrates another implementation of the impedance 22, 24, 26 and 28 having resistor R and variable resistor XR coupled in series. FIG. 3b illustrates another implementation of impedance 22, 24, 26 and 28 having resistor (1−K)R and variable resistor X'R coupled in series.

The G(X) function approximation to exponential function is not limited to provide positive gain, but also can provide attenuation (negative dB) gain function. This is achieved by using a negative value of X. A possible CMOS implementation may be shown in FIG. 4, wherein:

$$\left| \frac{V_0 + -V_0 -}{V_i + -V_i -} \right| = \frac{(1-X)C_S}{(1+X)C_S} = \frac{1-X}{1+X} \quad [3]$$

Hence by varying the polarity (signal) of X it is easy to achieve both gain (positive dB) and loss (negative dB) in one amplifier.

Figure 4:
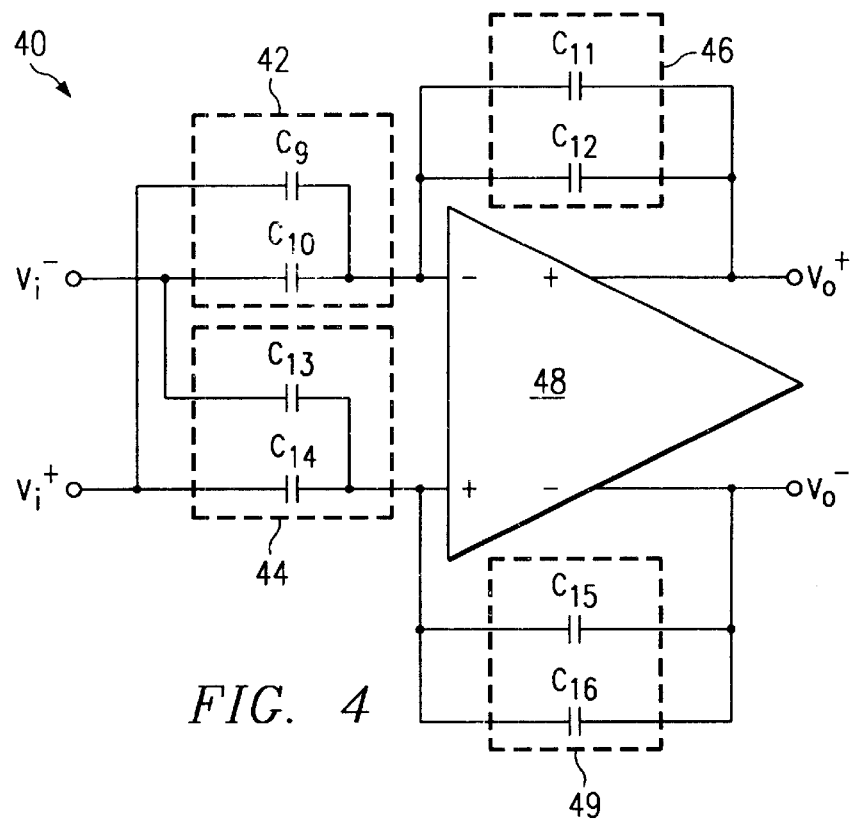
FIG. 4 is a block diagram of a third embodiment of the programmable gain amplifier in accordance with the present invention.

FIG. 4 discloses another embodiment of a PGA 40 having inputs, $V_i^-$ and $V_i^+$, and outputs, $V_o^-$ and $V_o^+$, in accordance with the present invention which includes a first and second sampling impedance, 42 and 44, a first and second feedback impedance, 46 and 49, and a gain element 48. Gain element 48 includes an inverting and non-inverting input and an inverting and non-inverting output, wherein the inverting and non-inverting outputs are connected to outputs, $V_o^-$ and $V_o^+$, respectively. The inverting input connects to the first sampling impedance 42. The non-inverting input connects to the second sampling impedance 44. As shown the first sampling impedance 42 includes capacitors $C_9$ and $C_{10}$ coupled in parallel and the second sampling impedance 44 includes capacitors $C_{13}$ and $C_{14}$ coupled in parallel. The first feedback impedance 46 connects between the inverting input and the non-inverting output. The second feedback impedance 49 connects between the non-inverting input and the inverting output. As shown the first feedback impedance 46 includes capacitors $C_{11}$ and $C_{12}$ coupled in parallel and the second feedback impedance 49 includes capacitors $C_{15}$ and $C_{16}$. Capacitors $C_{10}$, $C_{14}$, $C_{12}$ and $C_{15}$ of capacitance $C_s$; while $C_9$, $C_{11}$, $C_{13}$, and $C_{16}$ are variable capacitors $C_x = xC_s$ capacitors.

The architecture shown in FIGS. 1 and 4 results in a programmable gain/loss amplifier with linear control to achieve exponential transfer function. The circuits shown in these figures use two adjustable capacitors for each side, a total of four adjustable capacitors as is repeated in FIG. 5. Switches $SW_1$, $SW_2$, $SW_3$ and $SW_4$ are used to select a gain or a loss. The variable capacitors $C_x = xC_s$ are used to adjust the gain/loss amount according to the following equation:

$$\left| \frac{V_0 + -V_0 -}{V_i + -V_i -} \right| = \frac{(1+X)C_S}{(1-X)C_S} = \frac{1-X}{1+X} \quad [4]$$

Figure 5:
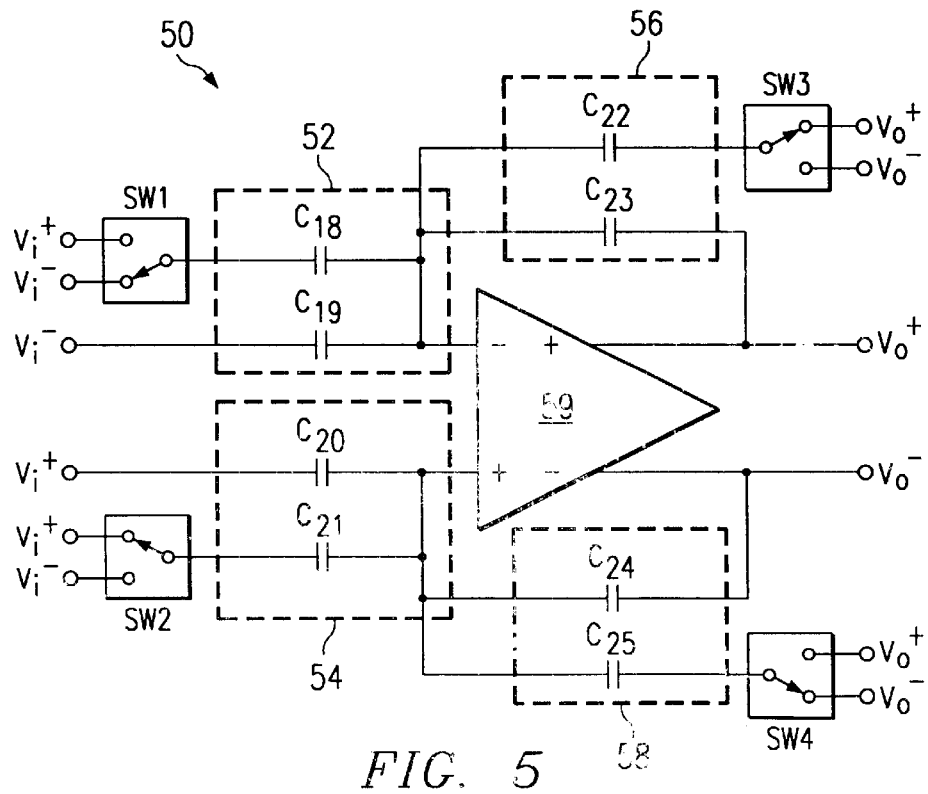
FIG. 5 is a block diagram of a fourth embodiment of the programmable gain amplifier in accordance with the present invention.

Specifically, FIG. 5 discloses another embodiment of a PGA 50 having inputs, $V_i^-$ and $V_i^+$, and outputs, $V_o^-$ and $V_o^+$, in accordance with the present invention which includes a first and second sampling impedance, 52 and 54, a first and second feedback impedance, 56 and 58, and a gain element 59. Gain element 59 includes an inverting and non-inverting input and an inverting and non-inverting output, wherein the inverting and non-inverting outputs are connected to outputs, $V_o^-$ and $V_o^+$, respectively. The inverting input connects to the first sampling impedance 52. The non-inverting input connects to the second sampling impedance 54. As shown the first sampling impedance 52 includes capacitors $C_{18}$ and $C_{19}$ coupled in parallel and the second sampling impedance 54 includes capacitors $C_{20}$ and $C_{21}$. Capacitors $C_{19}$ and $C_{20}$ connect to inputs, $V_i^-$ and $V_i^+$, respectively. Furthermore, capacitors $C_{18}$ and $C_{21}$ couple to switches, $SW_1$ and $SW_2$, respectively such that each capacitor toggles to be connectable to inputs, $V_i^-$ and $V_i^+$. The first feedback impedance 56 connects between the inverting input and the non-inverting output. The second feedback impedance 58 connects between the non-inverting input and the inverting output. As shown the first feedback impedance 56 includes capacitors $C_{22}$ and $C_{23}$ coupled in parallel and the second feedback impedance 58 includes capacitors $C_{24}$ and $C_{25}$ coupled in parallel. Capacitors $C_{24}$ and $C_{23}$ connect to outputs, $V_o^-$ and $V_o^+$, respectively. Furthermore, capacitors $C_{22}$ and $C_{25}$ couple to switches, $SW_3$ and $SW_4$, respectively such that each capacitor toggles to be connectable to inputs, $V_o^-$ and $V_o^+$.

Figure 6:
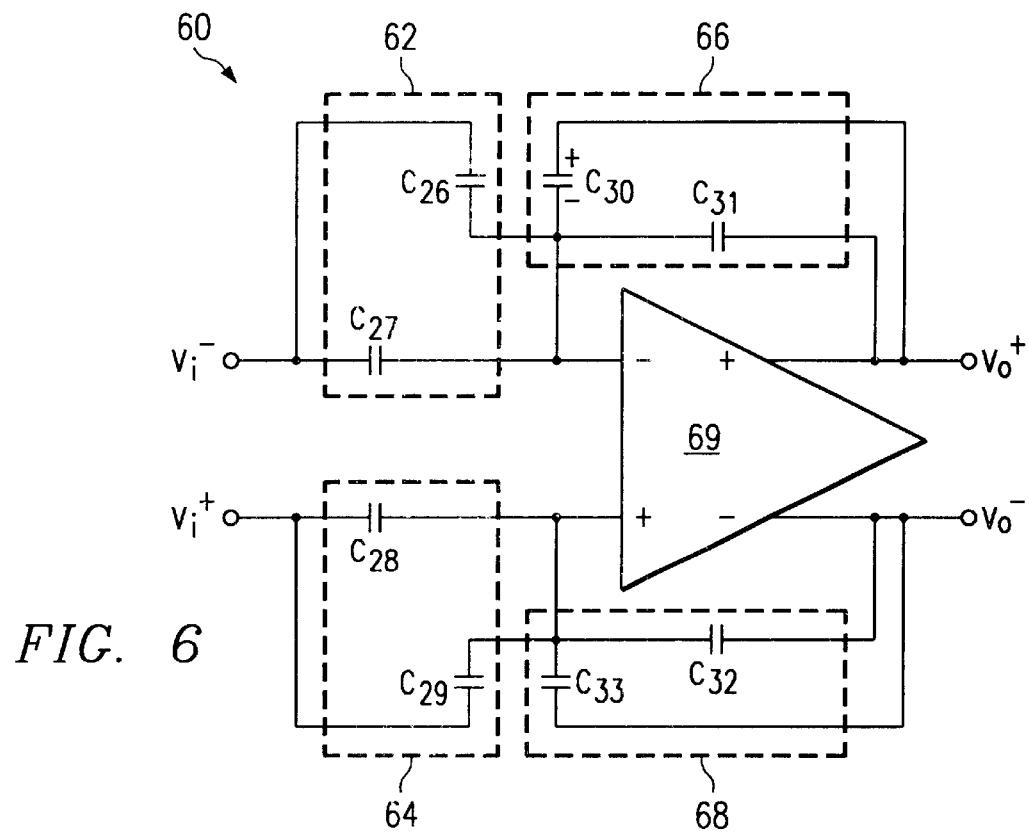
FIG. 6 is a block diagram of a fifth embodiment of the programmable gain amplifier in accordance with the present invention.

An improvement can be made to reduce the number of capacitors to achieve the same performance. The circuit 60 of FIG. 6 provides an exponential gain function. Note that $C_{30}$ is connected to $V_0+$ and that $C_{33}$ is connected to $V_0-$. In this circuit, $C_{26}+C_+=C_c$ and $C_{29}+C_{33}=C_c$, where $C_c$ is a constant size. Hence $C_2=C_c-C_1$. Capacitors $C_{27}$, $C_{28}$, $C_{31}$, $C_{32}$ are equivalent to $C_s$. Thus, the gain function is:

$$\left| \frac{V_0 + -V_0 -}{V_i + -V_i -} \right| = \frac{C_S + C_1}{C_S + C_2} = \frac{\left(C_S + \frac{C_c}{2}\right) + \left(C_1 - \frac{C_c}{2}\right)}{\left(C_S + \frac{C_c}{2}\right) - \left(C_1 - \frac{C_c}{2}\right)} = \frac{1+X}{1-X}$$

where $X = \dfrac{C_1 - \dfrac{C_c}{2}}{C_S + \dfrac{C_c}{2}}$

As shown in FIG. 6, PGA 60 having inputs, $V_i^-$ and $V_i^+$, and outputs, $V_o^-$ and $V_o^+$, includes a first and second sampling impedance, 62 and 64, a first and second feedback impedance, 66 and 68, and a gain element 69. Gain element 69 includes an inverting and non-inverting input and an inverting and non-inverting output, wherein the inverting and non-inverting outputs are connected to outputs, $V_o^-$ and $V_o^+$, respectively. The first sampling impedance 62 couples between the inverting input and input $V_i^-$. The second sampling impedance 64 couples between the non-inverting input and input $V_i^+$. As shown the first sampling impedance 62 includes capacitors $C_{26}$ and $C_{27}$ coupled in parallel and the second sampling impedance 64 includes capacitors $C_{28}$ and $C_{29}$ coupled in parallel. The first feedback impedance 66 connects between the inverting input and the non-inverting output. The second feedback impedance 68 connects between the non-inverting input and the inverting output. As shown the first feedback impedance 66 includes capacitors $C_{30}$ and $C_{31}$ coupled in parallel and the second feedback impedance 68 includes capacitors $C_{32}$ and $C_{33}$ coupled in parallel.

The advantages of the present invention include a reduced capacitor size and number, an avoidance of crossing capacitor connections, and both gain and loss functions are achieved since X can be positive or negative.

Since (1+X)/(1−X) is an approximation of an exponential function and the gain in a known switched capacitor amplifier configuration is:

$$\frac{C_S + C_f}{C_f} = 1 + \frac{C_S}{C_f}, \text{ then } \frac{1+X}{1-X} = \frac{1-X+2X}{1-X} = 1 + \frac{2X}{1-X}.$$

Thus, if a unit capacitor is removed from the feedback impedance in either of FIGS. 1, 4, 5 or 6 and two unit capacitors are added where one of them will be shared by the sampling impedance, the gain will change with equal steps in dB scale.

Figure 7:
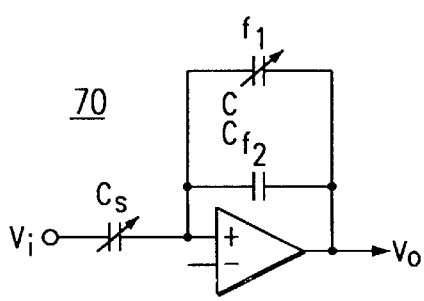
FIG. 7 is a block diagram of another embodiment of the programmable gain amplifier in accordance with the present invention.

An alternative embodiment shown in FIG. 7 which implements this switching scheme provides a gain function of G(X)=1+2*X/(1−X) using fewer components and having reduced bandwidth requirements on an operational amplifier. During sampling, input is sampled on both sample capacitor $C_s$ and feedback capacitor $C_f$ which has two components: capacitor $C_{f1}$ which is adjustable and capacitor $C_{f2}$ which is constant. Notice that when one unit capacitor is removed from capacitor $C_{f1}$, two units must be added capacitor $C_s$. Thus, half of the units of capacitor $C_s$ are shared with capacitor $C_{f1}$. During amplify phase, capacitors $C_s$ and $C_f$ are connected as shown in FIG. 7.

As shown in FIG. 7, for PGA 70 to have a gain range 0–6 dB with 40 steps, the total number of unit capacitors required is 160. If the same gain range is implemented with the conventional scheme as in Equation 3, 240 unit capacitors would be needed and would have a slower settling.

Figure 8A:
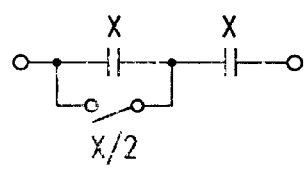
FIGS. 8a and b illustrate two implementations of the feedback impedance for the embodiment of FIG. 7.
Figure 8B:
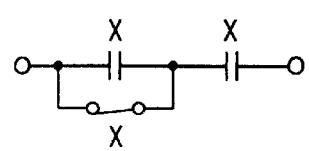

FIG. 8a discloses one unit of feedback capacitance and FIG. 8b displays the sampling. As shown two capacitors each of value X are connected in series, the resulting capacitance has a value of X/2 when the switch is opened in FIG. 8a. Thus, to implement the feedback impedance of FIG. 7, the circuits of FIGS. 8b and 8a may be used to implement X and X/2 with unit capacitors.

Figure 9:
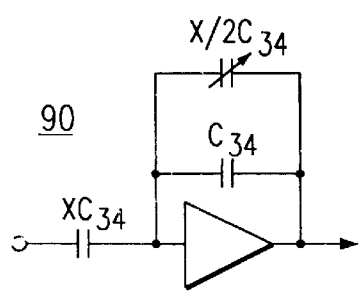

FIG. 9 represents an implementation of FIG. 7 having a single ended amplifier using much less capacitance, a total of 120 units, than the other embodiments disclosed. The maximum capacitance effective totals 80 units, and the gain is adjustable between 0–6 dB in 40 steps.

Advantages of this design include but are not limited to programmable gain amplifier implementable in bipolar or CMOS technology. This PGA has exponential gain control characteristics without dissipating substantial power.

As such, this highly programmable design can be used both in discrete and continuous time systems and does not require any off-chip components. Thus, this design meets the goal of extracting as much analog dynamic range from the image sensor without adding any noise with subsequent circuitry.

The present invention finds application in a great many video systems including digital still cameras, digital video cameras, digital video processing systems, CCD signal processors, and CMOS imagers, in a variety of industrial, medical, and military sensor and imaging applications.

The present invention provides significant advantages over conventional architectures including digital programmability, fine resolution, and compatibility for both continuous time and discrete time programmable gain amplifiers.

The reader's attention is directed to all papers and documents which are filed concurrently with this specification and which are open to public inspection with this specification, and the contents of all such papers and documents are incorporated herein by reference.

All the features disclosed in this specification (including any accompany claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

What is claimed is:

1. A programmable gain amplifier, comprising:
    a sampling impedance, wherein the sampling impedance includes a first variable capacitor;
    a gain element having an input and an output, the coupled to the sampling impedance, the gain element has an exponential gain characteristic of function:

$G(x)=(1+x)/(1-x)=1+2x/(1-x)$ where −0.7<x<0.7, such that operation of the programmable gain amplifier is independent of continuously supplied current and wherein a positive and negative increase of the sampling impedance is linearly proportional to an increase and decrease of the feedback impedance; and
    a feedback impedance coupled between the input and the output, wherein the feedback impedance includes a second and third capacitor coupled in parallel, wherein the second capacitor is a variable capacitor equal to x/2 times the value of the third capacitor and the first variable capacitor is equal to x times the value of the third capacitor, where −0.7<x<0.7.

2. A programmable gain amplifier, having a first and a second input, comprising:
    a first sampling impedance coupled to the first input;
    a second sampling impedance coupled to the second input;
    a gain element having an inverting input coupled to the first sampling impedance, a non-inverting input coupled to the second sampling impedance, an inverting and a non-inverting output, the gain element has an exponential gain characteristic of function:

$G(x)=(1+x)/(1-x)=1+2x/(1-x)$ where −0.7<x<0.7, such that operation of the programmable gain amplifier is independent of continuously supplied current and wherein a positive and negative increase of the sampling impedance is linearly proportional to an increase and decrease of the feedback impedance;
    a first feedback impedance coupled between the inverting input and the non-inverting output; and
    a second feedback impedance coupled between the non-inverting input and the inverting output.

3. The programmable gain amplifier as recited in claim 2, wherein the first sampling impedance includes a first and a second resistor coupled in series, wherein the second resistor is a variable resistor equal to x times the value of the first resistor.

4. The programmable gain amplifier as recited in claim 2, wherein the second sampling impedance includes a first and a second resistor coupled in series, wherein the second resistor is a variable resistor equal to x times the value of the first resistor.

5. The programmable gain amplifier as recited in claim 2, wherein the first feedback impedance includes a first and a second resistor coupled in series, wherein the second resistor is a variable resistor equal to x times the value of the first resistor.

6. The programmable gain amplifier as recited in claim 2, wherein the second feedback impedance includes a first and a second resistor coupled in series, wherein the second resistor is a variable resistor equal to x times the value of the first resistor.

7. The programmable gain amplifier as recited in claim 2, further comprising:
   a third feedback impedance coupled between the inverting input and the inverting output; and
   a fourth feedback impedance coupled between the non-inverting input and the non-inverting output.

8. The programmable gain amplifier as recited in claim 7, wherein the first feedback impedance is a capacitor.

9. The programmable gain amplifier as recited in claim 7, wherein the second feedback impedance is a capacitor.

10. The programmable gain amplifier as recited in claim 7, wherein the third feedback impedance is a capacitor.

11. The programmable gain amplifier as recited in claim 7, wherein the fourth feedback impedance is a capacitor.

12. A programmable gain amplifier, comprising:
   a first sampling impedance, wherein the first sampling impedance includes a first and second resistor coupled in series, wherein the second resistor is a variable resistor equal to x times the value of the first resistor, where $-0.7<x<0.7$;
   a second sampling impedance wherein the second sampling impedance includes a third and fourth resistor coupled in series, wherein the fourth resistor is a variable resistor equal to x times the value of the third resistor;
   a gain element having an inverting input coupled to the first sampling impedance, a non-inverting input coupled to the second sampling impedance, an inverting and a non-inverting output, the gain element has an exponential gain characteristic of function:

$$G(x)=(1+x)/(1-x)=1+2x/(1-x)$$

where $-0.7<x<0.7$, such that operation of the programmable gain amplifier is independent of continuously supplied current and wherein a positive and negative increase of the sampling impedance is linearly proportional to an increase and decrease of the feedback impedance;
   a first feedback impedance coupled between the inverting input and the non-inverting output, wherein the first feedback impedance includes a fifth and sixth resistor coupled in series, wherein the sixth resistor is a variable resistor equal to x times the value of the fifth resistor; and
   a second feedback impedance coupled between the non-inverting input and the inverting output, wherein the second feedback impedance includes a seventh and eighth resistor coupled in series, wherein the eighth resistor is a variable resistor equal to x times the value of the seventh resistor.

13. A programmable gain amplifier, comprising:
   a first sampling impedance, wherein the first sampling impedance includes a first and second capacitor coupled in parallel, wherein the second capacitor is a variable capacitor equal to x times the value of the first capacitor, where $-0.7<x<0.7$;
   a second sampling impedance wherein the second sampling impedance includes a third and fourth capacitor coupled in parallel, wherein the fourth capacitor is a variable capacitor equal to x times the value of the third capacitor;
   a gain element having an inverting input coupled to the first sampling impedance, a non-inverting input coupled to the second sampling impedance, an inverting and a non-inverting output, the gain element has an exponential gain characteristic of function:

$$G(x)=(1+x)/(1-x)=1+2x/(1-x)$$

where $-0.7<x<0.7$, such that operation of the programmable gain amplifier is independent of continuously supplied current and wherein a positive and negative increase of the sampling impedance is linearly proportional to an increase and decrease of the feedback impedance;
   a first feedback impedance, the first feedback impedance includes a fifth and sixth capacitor, the sixth capacitor is a variable capacitor equal to x times the value of the fifth capacitor, the sixth capacitor coupled between the inverting input and the inverting output, the fifth capacitor coupled between the inverting input and the non-inverting output; and
   a second feedback impedance, the second feedback impedance includes a seventh and eighth capacitor, the eighth capacitor is a variable capacitor equal to x times the value of the seventh capacitor, the eighth capacitor coupled between the non-inverting input and the inverting output, the seventh capacitor coupled between the non-inverting input and the non-inverting output.

14. A programmable gain amplifier, having a positive input and a negative input, comprising:
   a first sampling impedance, the first sampling impedance includes a first and second capacitor, the second capacitor is a variable capacitor equal to x times the value of the first capacitor, where $-0.7<x<0.7$;
   a second sampling impedance, the second sampling impedance includes a third and fourth capacitor, the fourth capacitor is a variable capacitor equal to x times the value of the third capacitor;
   a gain element having an inverting and non-inverting, the first capacitor coupled between the negative input and the inverting input, the second capacitor coupled between the positive input and the inverting input, the third capacitor coupled between the negative input and the non-inverting input, the fourth capacitor coupled between the positive input and the non-inverting input, the gain element has an exponential gain characteristic of function:

$$G(x)=(1+x)/(1-x)=1+2x/(1-x)$$

where $-0.7<x<0.7$, such that operation of the programmable gain amplifier is independent of continuously supplied current and wherein a positive and negative increase of the sampling impedance is linearly proportional to an increase and decrease of the feedback impedance;
   a first feedback impedance, the first feedback impedance includes a fifth and sixth capacitor coupled in parallel, the sixth capacitor is a variable capacitor equal to x times the value of the fifth capacitor; and
   a second feedback impedance, the second feedback impedance includes a seventh and eighth capacitor coupled in parallel, the eighth capacitor is a variable capacitor equal to x times the value of the seventh capacitor.

15. A programmable gain amplifier, having a positive input and a negative input, comprising:

a first sampling impedance, the first sampling impedance includes a first and second capacitor, the second capacitor is a variable capacitor equal to x times the value of the first capacitor, where −0.7<x<0.7;

a second sampling impedance, the second sampling impedance includes a third and fourth capacitor, the fourth capacitor is a variable capacitor equal to x times the value of the third capacitor;

a first switch coupled to receive input signals from the positive and negative input, the first switch coupled to the first capacitor;

a second switch coupled to receive input signals from the positive and negative input, the second switch coupled to the third capacitor;

a gain element, having an inverting and non-inverting, the first and second capacitor coupled to the inverting input, the third and fourth capacitor coupled to the non-inverting input, the gain element has an exponential gain characteristic of function:

$$G(x)=(1+x)/(1-x)=1+2x/(1-x)$$

where −0.7<x<0.7, such that operation of the programmable gain amplifier is independent of continuously supplied current and wherein a positive and negative increase of the sampling impedance is linearly proportional to an increase and decrease of the feedback impedance;

a third switch coupled to provide a positive and negative output;

a first feedback impedance, the first feedback impedance includes a fifth and sixth capacitor, the sixth capacitor is a variable capacitor equal to x times the value of the fifth capacitor, the sixth capacitor coupled between the inverting input and the third switch, the fifth capacitor coupled between the inverting input and the non-inverting output;

a fourth switch coupled to provide a positive and negative output; and a second feedback impedance, the second feedback impedance includes a seventh and eighth capacitor, the eighth capacitor is a variable capacitor equal to x times the value of the seventh capacitor, the eighth capacitor coupled between the non-inverting input and the fourth switch, the seventh capacitor coupled between the non-inverting input and the inverting output.

\* \* \* \* \*